United States Patent
Osiroff et al.

(10) Patent No.: US 11,880,031 B1
(45) Date of Patent: Jan. 23, 2024

(54) STRAIN-BASED SENSING OF DUAL-AXIS MIRROR ROTATION

(71) Applicant: Apple Inc., Cupertino, CA (US)

(72) Inventors: Nadav Osiroff, Herzliya (IL); Noel Axelrod, Jerusalem (IL); Raviv Erlich, Kibbutz Beit Nir (IL)

(73) Assignee: APPLE INC., Cupertino, CA (US)

( * ) Notice: Subject to any disclaimer, the term of this patent is extended or adjusted under 35 U.S.C. 154(b) by 470 days.

(21) Appl. No.: 17/123,217

(22) Filed: Dec. 16, 2020

Related U.S. Application Data

(60) Provisional application No. 62/960,724, filed on Jan. 14, 2020.

(51) Int. Cl.
| | | |
|---|---|---|
| G02B 26/08 | (2006.01) | |
| G02B 26/10 | (2006.01) | |
| G01L 1/18 | (2006.01) | |
| B81B 3/00 | (2006.01) | |

(52) U.S. Cl.
CPC ........ *G02B 26/0833* (2013.01); *B81B 3/0067* (2013.01); *G01L 1/18* (2013.01); *G02B 26/105* (2013.01); *B81B 2201/042* (2013.01)

(58) Field of Classification Search
CPC .............. G02B 26/0833; G02B 26/105; B81B 3/0067; B81B 2201/042; G01L 1/18
See application file for complete search history.

(56) References Cited

U.S. PATENT DOCUMENTS

| | | | |
|---|---|---|---|
| 7,952,781 B2 | 5/2011 | Weiss et al. | |
| 9,470,503 B2 * | 10/2016 | Gerson | G02B 26/0858 |
| 10,018,723 B2 | 7/2018 | Sromin et al. | |
| 2001/0048784 A1 | 12/2001 | Behin et al. | |
| 2005/0078169 A1 | 4/2005 | Tumer | |
| 2006/0125597 A1 | 6/2006 | Kamiya et al. | |

(Continued)

FOREIGN PATENT DOCUMENTS

| | | |
|---|---|---|
| CN | 101379377 A | 3/2009 |
| CN | 102288787 A | 12/2011 |

(Continued)

OTHER PUBLICATIONS

Liu, C., "Foundations of MEMS", Prentice Hall, Second Edition, Chapter 6, pp. 231-268, year 2012.

(Continued)

*Primary Examiner* — Euncha P Cherry
(74) *Attorney, Agent, or Firm* — Kligler & Associates Patent Attorneys Ltd.

(57) ABSTRACT

Mechanical apparatus includes a rotational assembly, including a frame and a gimbal, which is attached to the frame by first hinges disposed along a first axis and is configured to rotate on the first hinges about the first axis relative to the frame. A rotating element is attached to the gimbal by second hinges disposed along a second axis, perpendicular to the first axis, and is configured to rotate on the second hinges about the second axis relative to the gimbal. One or more strain sensors are disposed on at least one of the first hinges and configured to provide a signal indicative of a rotation of the rotating element about the second axis relative to the gimbal. Control circuitry is configured to monitor the rotation of the rotating element about the second axis responsively to the signal.

20 Claims, 6 Drawing Sheets

(56) References Cited

U.S. PATENT DOCUMENTS

| | | |
|---|---|---|
| 2009/0059344 A1 | 3/2009 | Marxer et al. |
| 2010/0195180 A1 | 8/2010 | Akanuma et al. |
| 2011/0199284 A1 | 8/2011 | Davis et al. |
| 2013/0163061 A1 | 6/2013 | Kanno et al. |
| 2014/0062506 A1 | 3/2014 | Defazio et al. |
| 2014/0313558 A1 | 10/2014 | Davis et al. |
| 2015/0103321 A1 | 4/2015 | Reiss et al. |

FOREIGN PATENT DOCUMENTS

| | | |
|---|---|---|
| DE | 19709913 A1 | 10/1998 |
| EP | 2851733 A2 | 3/2015 |
| JP | 2011020207 A | 2/2011 |
| JP | 2011215324 A | 10/2011 |
| JP | 2012237788 A | 12/2012 |
| WO | 2014016794 A1 | 1/2014 |

OTHER PUBLICATIONS

Clausen et al., "Design and processing of a cost-effective piezoresistive MEMS cantilever sensor for medical and biomedical use", Journal of Micromechanics and Microengingeering, vol. 22, pp. 1-6, Jun. 22, 2012.

Bao et al., "Geometrical Rules of Four-Terminal Gauge for Pressure Sensors", Sensors and Actuators 18, pp. 149-156, year 1989.

* cited by examiner

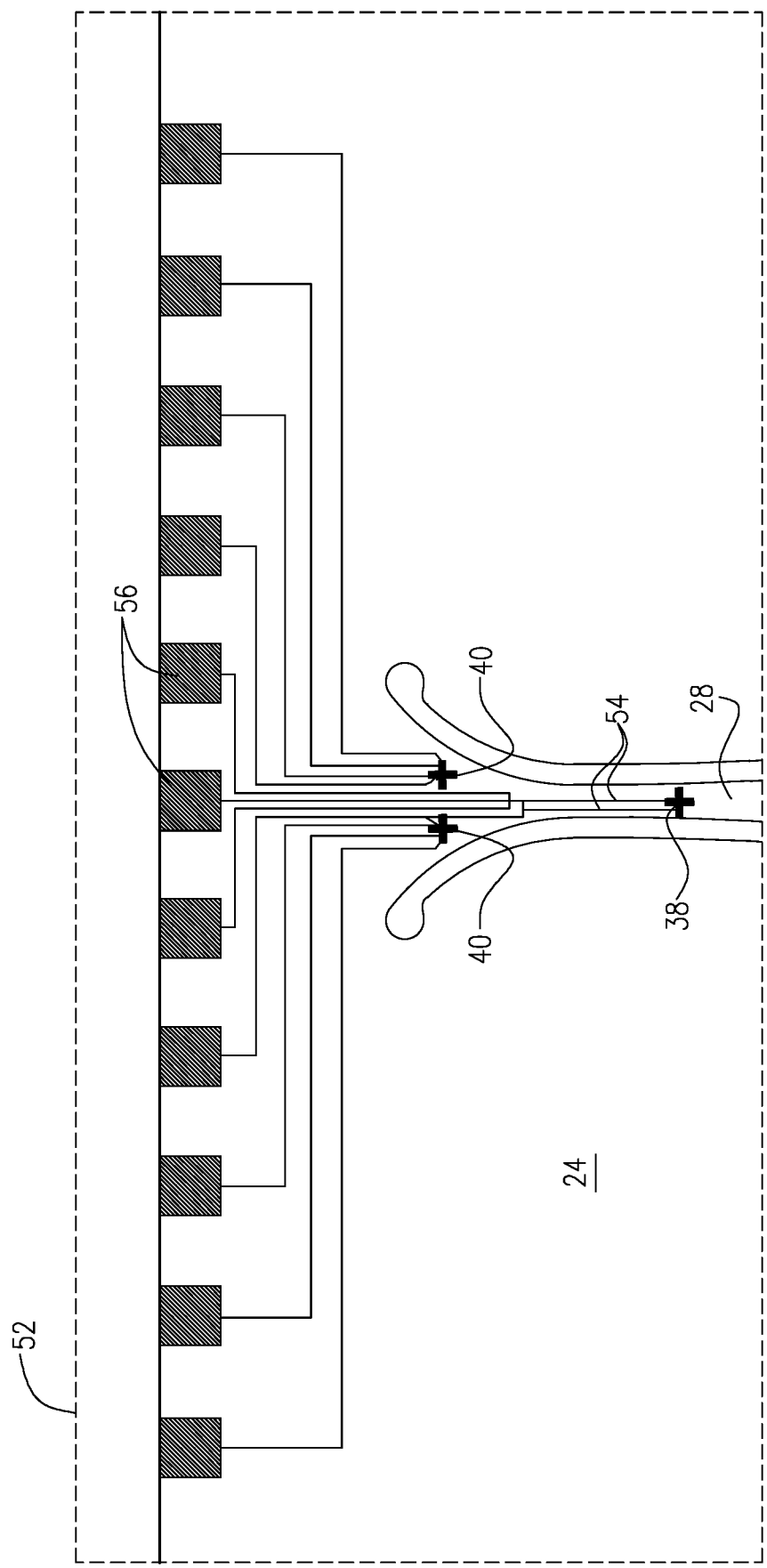

STRAIN-BASED SENSING OF DUAL-AXIS MIRROR ROTATION

CROSS-REFERENCE TO RELATED APPLICATION

This application claims the benefit of U.S. Provisional Patent Application 62/960,724, filed Jan. 14, 2020, which is incorporated herein by reference.

FIELD OF THE INVENTION

The present invention relates to monitoring the motion of rotating mechanical devices, and particularly of scanning micromirrors.

BACKGROUND

U.S. Pat. No. 10,018,723, whose disclosure is incorporated herein by reference, describes scanning micromirrors based on microelectromechanical systems (MEMS). Embodiments described in this application provide scanning mirror assemblies that include a support structure; a base (also referred to as a gimbal), which is mounted to rotate about a first axis relative to the support structure; and a mirror, which is mounted to rotate about a second axis relative to the base.

Strain-based sensors (typically piezoresistive or metallic) are commonly used for measuring deflection of membranes, sensing pressure, measuring deflection of cantilever beams in accelerometers and gyros, and other applications. Various types of strain sensors are known in the art. For example, in a metallic strain sensor, the resistance of a metal resistor changes due to shape deformation that can occur in response to strain. Doped silicon exhibits a strong piezoresistive response, meaning that its resistance changes markedly as a function of the strain itself, which can result from various modes of applied stress. Resistive strain sensing and its use in MEMS are described, for example by Liu in Foundations of MEMS (Illinois ECE Series, Northwestern University, 2005), Chapter 6, which is incorporated herein by reference.

In this regard, U.S. Pat. No. 9,470,503, whose disclosure is incorporated herein by reference, describes mechanical apparatus including a base, a moving element, and a hinge, having a first end attached to the moving element. A supporting structure is attached to the base and to the second end of the hinge and has at least a component perpendicular to the hinge so as to translate rotation of the moving element about the hinge into elongation of the component, whereby the moving element rotates about the hinge relative to the base while the supporting structure is deformed as a result of the rotation of the moving element about the hinge. A strain-based rotation sensor is associated with the supporting structure and is configured to provide a signal indicative of the rotation of the moving element responsively to a strain induced due to deformation of the supporting structure as the result of the rotation of the moving element.

SUMMARY

Embodiments of the present invention that are described hereinbelow provide improved methods and devices for rotational sensing.

There is therefore provided, in accordance with an embodiment of the invention, mechanical apparatus, including a rotational assembly, which includes a frame and a gimbal, which is attached to the frame by first hinges disposed along a first axis and is configured to rotate on the first hinges about the first axis relative to the frame. A rotating element is attached to the gimbal by second hinges disposed along a second axis, perpendicular to the first axis, and is configured to rotate on the second hinges about the second axis relative to the gimbal. One or more strain sensors are disposed on at least one of the first hinges and configured to provide a signal indicative of a rotation of the rotating element about the second axis relative to the gimbal. Control circuitry is configured to monitor the rotation of the rotating element about the second axis responsively to the signal.

In some embodiments, the one or more strain sensors include at least one first strain sensor and at least one second strain sensor disposed on the at least one of the first hinges, wherein the at least one first strain sensor is configured to provide a first signal indicative of a rotation of the gimbal about the first axis, and the at least one second strain sensor is configured to provide a second signal indicative of the rotation of the rotating element about the second axis. In one such embodiment, the at least one first strain sensor includes at least two first strain sensors, which are disposed on the at least one of the first hinges in mutually-adjacent locations on opposing sides of the first axis. Additionally or alternatively, the at least one first strain sensor is configured to provide the first signal in response to a torsional stress in the at least one of the first hinges, while the at least one second strain sensor is configured to provide the second signal in response to a bend stress induced in the at least one hinge due to the rotation of the rotating element about the second axis.

In a disclosed embodiment, the first hinges include a pair of first hinges disposed between the gimbal and the frame on opposing sides of the gimbal, and wherein the one or more strain sensors include at least one respective strain sensor disposed on each of the pair of the first hinges.

In one embodiment, the rotating element includes a mirror, and the apparatus includes a drive assembly, which is coupled to scan the mirror about the first and second axes, and the control circuitry is configured to control the drive assembly responsively to the signal.

In some embodiments, at least the frame, the gimbal, the rotating element and the hinges are formed from a semiconductor substrate in a microelectromechanical systems (MEMS) process, and the one or more strain sensors are formed on the semiconductor substrate as a part of the MEMS process. In a disclosed embodiment, the apparatus include a terminal disposed at an edge of the frame for connection to the control circuitry, and electrical traces running on the semiconductor substrate along the at least one of the first hinges between the one or more strain sensors and the terminal.

In a disclosed embodiment, the one or more strain sensors have a resistance that varies responsively to a strain in the first hinges, and the control circuitry is configured to measure an angle of the rotation of the rotating element responsively to the varying resistance. Additionally or alternatively, the gimbal and the hinges include a semiconductor material, and the one or more strain sensors each include a cruciform doped region within the semiconductor material having two pairs of mutually-perpendicular arms, and wherein the control circuitry is coupled to respective ends of the arms in order to sense the angle of the rotation.

There is also provided, in accordance with an embodiment of the invention, a method for rotational control, which includes attaching a gimbal to a frame by first hinges disposed along a first axis so that the gimbal rotates on the first hinges about the first axis relative to the frame. A rotating element is attached to the gimbal by second hinges disposed along a second axis, perpendicular to the first axis, so that the rotating element rotates on the second hinges about the second axis relative to the gimbal. One or more strain sensors are disposed on at least one of the first hinges so as to provide a signal indicative of a rotation of the rotating element about the second axis relative to the gimbal. The rotation of the rotating element about the second axis is monitored responsively to the signal.

The present invention will be more fully understood from the following detailed description of the embodiments thereof, taken together with the drawings in which:

BRIEF DESCRIPTION OF THE DRAWINGS

FIG. 2B is a schematic detail view of a part of the assembly of FIG. 2A;

DETAILED DESCRIPTION OF EMBODIMENTS

Figure 1:
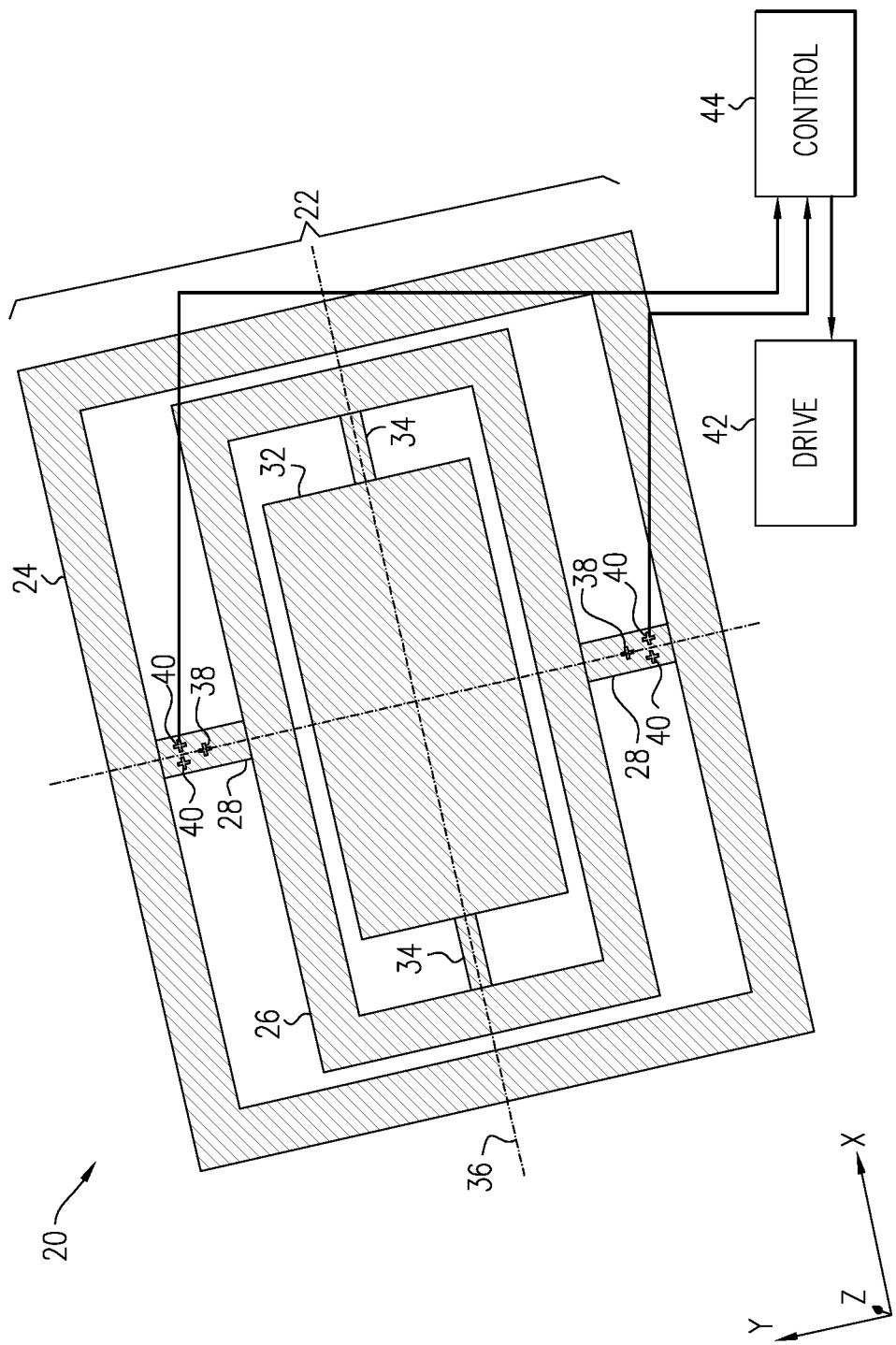
FIG. 1 is a schematic frontal view of opto-mechanical scanning apparatus, in accordance with an embodiment of the invention.

Strain sensors are an attractive choice for sensing rotation (and other modes of motion) in MEMS devices, because they can be produced on the semiconductor substrate as part of the MEMS fabrication process. For example, strain sensors with dimensions in the range of tens to hundreds of microns can be produced by doping a region of the substrate and connecting electrical traces on the substrate to opposing edges of the region. The resistance between the traces varies as a function of the strain in the doped region. In rotating MEMS devices, such as scanning mirrors mounted on hinges, the strain sensors are typically located on or in close proximity to the hinges whose rotation is to be measured. Strain sensors of this sort are used, for example, in the above-mentioned U.S. Pat. No. 9,470,503.

To measure the resistance across a strain sensor, the electrical traces that connect to the doped region (or other strain-responsive structure) must be coupled to a suitable measurement circuit. When the strain sensor is located on a hinge, the electrical traces typically run along the hinge to terminals at the edge of the MEMS structure, which connect to the measurement circuit. When the MEMS structure has multiple, nested axes of rotation with corresponding sets of hinges, such as in the gimballed dual-axis mirror described in the above-mentioned U.S. Pat. No. 10,018,723, and the strain sensor is located on the inner hinges, it may be necessary to run the traces around the gimbal and across the hinges of the gimbal in order to reach the terminals. These long traces, passing across the narrow hinges, can cause difficulties in fabrication and are also prone to breakage and picking up interference.

Embodiments of the present invention that are described herein address these difficulties by positioning the strain sensor (or sensors) that is to be used in sensing rotation of the inner hinge of a gimbaled rotating element at a location on the outer hinge, on which the gimbal rotates. The inventors have found that the rotation of the rotating element about the inner hinges gives rise to substantial bending stress in the outer hinges; and the signal output by a strain sensor that is appropriately located on the outer hinge can thus give a good indication of the actual rotation of the inner hinges. Positioning the strain sensor in this manner on the outer hinge substantially shortens the electrical traces that connect the strain sensor to the terminals of the measurement circuit, and thus alleviates the problems noted above. Furthermore, two or more strain sensors, located in mutual proximity on the outer hinge, can be used to monitor rotation about both the inner and outer hinges.

The disclosed embodiments thus provide mechanical apparatus, in which a rotational assembly comprises a gimbal, which is attached to a frame by first hinges disposed along a first axis, and rotates about this first axis on the first hinges relative to the frame. A rotating element, such as a mirror, is attached to the gimbal by second hinges disposed along a second axis, perpendicular to the first axis, and rotates about this second axis on the second hinges relative to the gimbal. One or more strain sensors, disposed on at least one of the first hinges, provide a signal indicative of the rotation of the rotating element about the second axis. Control circuitry receives this signal and thus monitors the rotation of the rotating element about the second axis.

The embodiments that are described below relate specifically to a MEMS-based scanning mirror assembly, in which the gimbal is contained inside the frame, and the mirror is contained insider the gimbal. Thus, the first and second hinges are referred to as the outer and inner hinges, respectively. Alternatively, the principles of the present invention may be applied in other device geometries, for monitoring not only scanning mirrors, but also other types of gimballed rotating elements. Furthermore, although the present embodiments are particularly advantageous in the context of MEMS, the principles of the present invention may also be implemented using other fabrication technologies. All such alternative applications and implementations are considered to be within the scope of the present invention.

FIG. 1 is a schematic frontal view of opto-mechanical scanning apparatus 20, in accordance with an embodiment of the invention. The apparatus comprises a rotational assembly 22, which is formed from a semiconductor substrate in a MEMS process, in which the elements of assembly 22 are defined by a photolithographic mask, and the substrate is then etched to release the moving elements from the surrounding parts, as is known in the art. Rotational assembly 22 comprises a frame 24, which contains a gimbal 26, which is attached to the frame by a pair of outer hinges 28. Gimbal 26 rotates relative to frame 24 on hinges 28, about a first axis 30 running through hinges 28. For the sake of convenience, axis 30 is taken to be parallel to the Y-axis in the present description.

A rotating mirror 32 is attached to gimbal 26 by a pair of inner hinges 34, which are disposed along a second axis 36 (parallel to the X-axis in this example), which is perpendicular to axis 30. A drive assembly 42 drives mirror 32 to rotate on hinges 34 about axis 36 relative to gimbal 26, while driving the gimbal to rotate about axis 30 relative to frame 24. Drive assembly 42 may comprise any suitable sort of mechanism that is known in the art, such as the sort of electromagnetic drive that is described in the above-mentioned U.S. Pat. No. 10,018,723, or an electrostatic drive. The rotations of the mirror and the gimbal about the respective axes can be timed and synchronized to define a scan pattern of mirror 32, such as a raster pattern, according to which rotational assembly 22 scans a beam of light that is reflected from the mirror. Typically (although not necessarily), the rate of rotation of mirror 32 about axis 36 is much faster than about axis 30, and for this reason, axes 36 and 30 are respectively referred to as the fast and slow axes of assembly 22. Alternatively, drive assembly 42 can drive mirror 32 to rotate along substantially any arbitrary angular path.

To monitor and control the operation of apparatus 20, strain sensors 38 and 40 are formed, for example as a part of the MEMS process, on one or both of outer hinges 28. Details of these strain sensors are shown in the figures that follow. Strain sensors 38 provide a signal that is indicative of the rotation of mirror 32 about axis 36 relative to gimbal 26, while strain sensors 40 provide a signal that is indicative of the rotation of gimbal 26 (and hence of mirror 32) about axis 30. More specifically, strain sensors 40 are disposed on each of hinges 28 in mutually-adjacent locations on opposing sides of axis 30. The pictured configuration enables the pair of strain sensors 40 to provide a differential signal that is indicative of torsional stress in each hinge 28. The pair of strain sensors 38 on the two hinges 28 provides a differential signal that is indicative of the bend stress induced in hinges 28 due to the rotation of mirror 32 about axis 36.

This use of pairs of strain sensors in providing differential signals is advantageous in enhancing the precision of the measurements of the rotations of mirror 32 and gimbal 26; but alternatively a single, respective strain sensor could be used on each of the axes. Furthermore, to monitor a single axis of rotation, strain sensors 38 can be used alone, without sensors 40, or vice versa.

Control circuitry 42 receives and processes the signals from strain sensors 38 and 40 in order to monitor the rotations of mirror 32 and gimbal 26. The control circuitry is thus able to derive the instantaneous angle of rotation of mirror 32 about each of axes 30 and 36, and can thus input control signals to drive assembly 42 in order to correct for any deviations from the desired scan pattern. Control circuitry 42 typically comprises digital logic circuits with suitable analog inputs and outputs for receiving the sensor signals from strain sensors 38 and 40 and outputting control signals to drive assembly 42. The digital logic circuits may comprise hard-wired or programmable logic components, for example, and/or a programmable microcontroller, which is programmed in software or firmware to perform the functions described above.

Figure 2A:
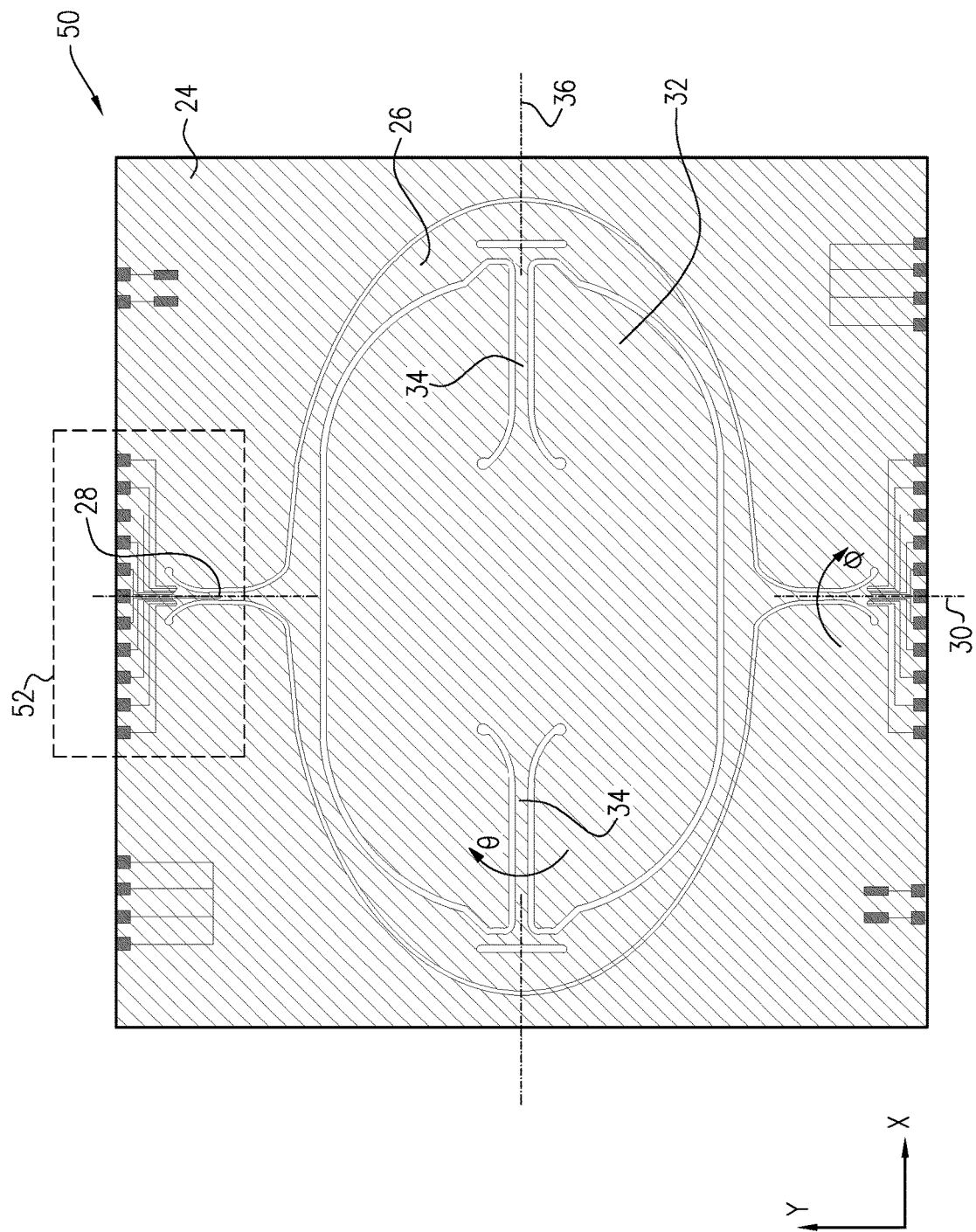
FIG. 2A is a schematic pictorial view of a rotational assembly, in accordance with another embodiment of the invention.

Reference is now made to FIGS. 2A and 2B, which schematically illustrate a rotational assembly 50, in accordance with another embodiment of the invention. FIG. 2A is a pictorial overview of assembly 50, while FIG. 2B shows a detail 52 of the placement of strain sensors 38, 40 and electrical traces 54 connecting to the strain sensors. Rotational assembly 50 may be substituted for rotational assembly 22 in apparatus 20 (FIG. 1), and operates on similar principles. Therefore, where applicable, the elements of rotational assembly 50 are labeled with the same numbers as the corresponding elements of rotational assembly 22. In FIG. 2A, axis 30, passing through hinges 28, is labeled as the "slow axis," and the angle of rotation of gimbal 26 about this axis is labeled $\phi$; while axis 36, passing through hinges 34, is labeled as the "fast axis," and the angle of rotation of mirror 32 about this axis is labeled $\theta$.

As shown in inset 52, hinge 28 has a tapered shape that is chosen so as to maximize the bending stress at the location where strain sensor 38 is formed. Strain sensors 38 each comprise a cruciform doped region within the semiconductor material of hinge 28, having two pairs of mutually-perpendicular arms (as shown in detail in FIG. 3). Alternatively, strain sensors 38 may have different shapes and compositions, as are known in the art. For example, strain sensors 38 and 40 may comprise a strain-responsive metal coating that is deposited on the surface of the substrate. Additionally or alternatively, strain sensors 38 and 40 may be formed in linear, "pi-shaped," serpentine, or H-shaped patterns, or any other suitable sort of shape that is known in the art.

Electrical traces 54 are deposited on the semiconductor substrate, as part of the MEMS fabrication process, and run along hinge 28 to connect the arms of strain sensor 38 to terminals 56 at the edge of frame 24. Other traces are deposited to connect sensors 40 to the terminals. Control circuitry 44 interfaces to strain sensors 38 and 40 via terminals 56 in order to sense the angles of rotation.

Figure 3:
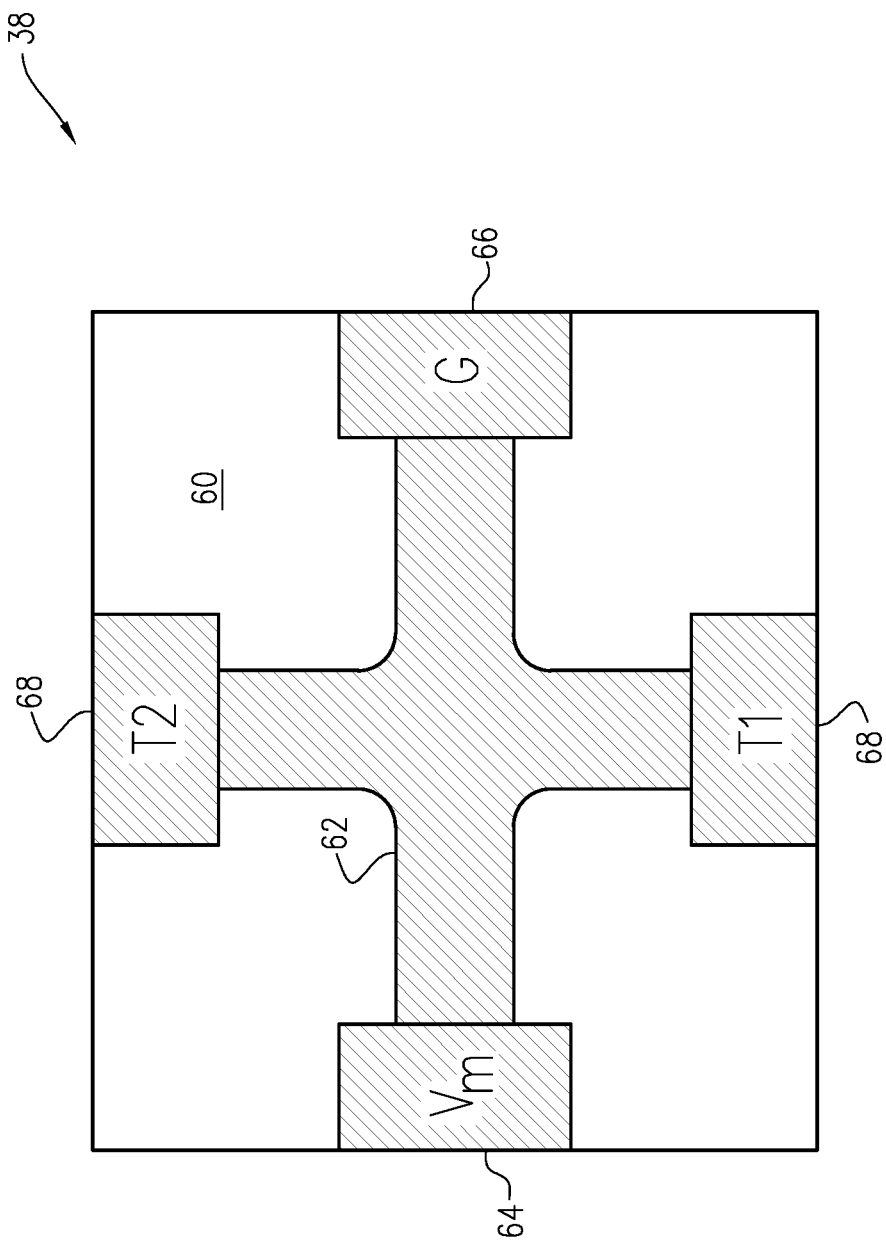
FIG. 3 is a schematic detail view of a strain sensor, in accordance with an embodiment of the invention.

FIG. 3 is a schematic detail view of strain sensor 38, in accordance with an embodiment of the invention. (Strain sensors 40 are typically of similar design.) As noted earlier, strain sensor 38 comprises a cruciform doped region 62 within a semiconductor material 60, such as silicon, from which frame 24 is fabricated. For example, region 62 may be produced by injecting boron ions into the silicon substrate. The cruciform region has two pairs of mutually-perpendicular arms, which end in respective electrodes 64, 66 and 68, comprising copper pads, for example, which contact the opposing ends of the arms of region 62 along mutually perpendicular axes. In an example configuration, one of these axes is parallel to hinge 28, while the other axis is perpendicular to the hinge.

To measure the strain in sensor 38, control circuitry 44 applies a modulated voltage Vm between electrode 64 and electrode 66, which serves as the ground (G). Control circuitry measures the resulting voltage signals on electrodes 68, which serve as sense terminals (T1 and T2), and thus senses changes in resistance as a result of the bending stress in hinge 28. This sort of sensing configuration makes use of the "pseudo-Hall effect," based on the shear piezoresistive effect, whereby the induced shear stress distorts the potential distribution in a piezoresistive plane. The strain due to bending stress in strain sensors 40 is measured in similar fashion.

Figure 4:
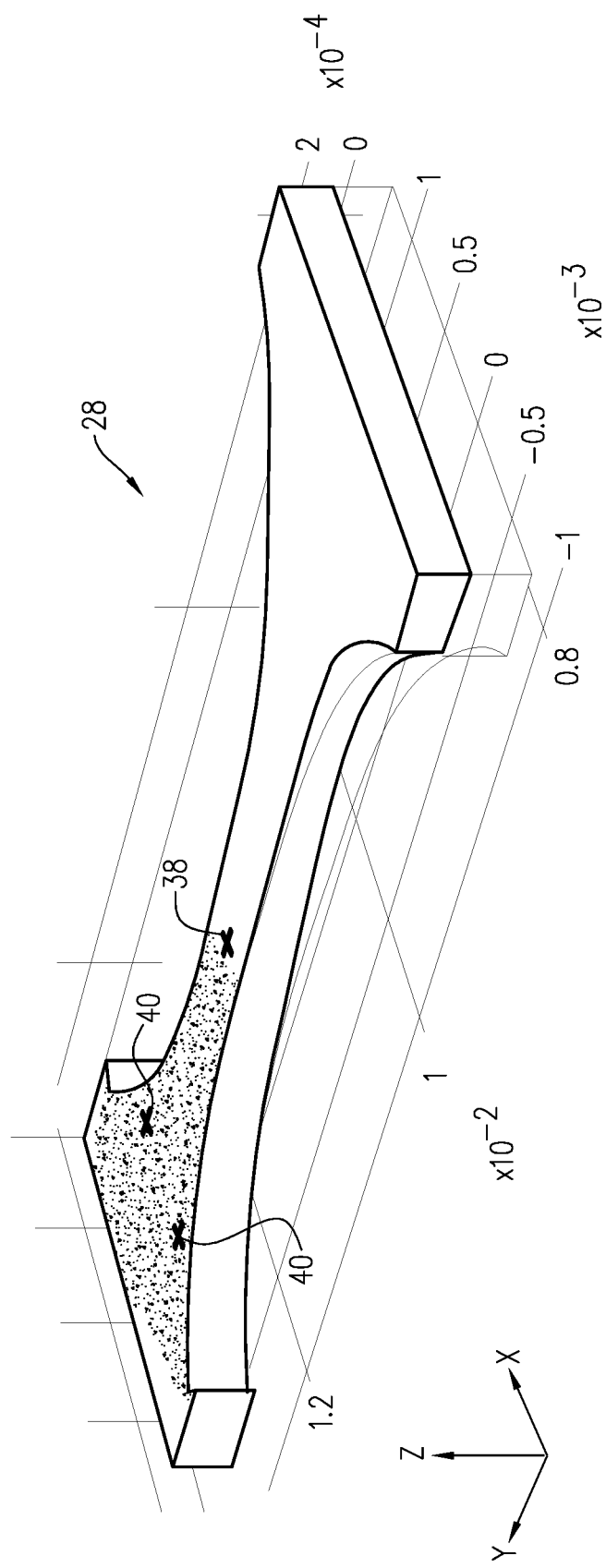
FIG. 4 is a schematic detail view of a hinge in a rotational assembly, in accordance with an embodiment of the invention.

FIG. 4 is a schematic detail view of hinge 28, illustrating bending of the hinge due to the rotation of mirror 32 about axis 36, in accordance with an embodiment of the invention. The distribution of stresses in hinge 28 is represented by different shading along the surface of the hinge in the figure.

The dimensions in the figure are shown, by way of example, in meters, and show that the rotation of mirror 32 causes hinge 28 to bend by about 0.2 mm. This bending gives rise to longitudinal stress in sensor 38, resulting in a piezoresistive signal that increases roughly linearly with the rotation of mirror 32 about axis 36 in the $-\theta$ direction. The hinge 28 on the opposite side of mirror 32 will bend in the opposite direction, giving rise to a piezoresistive signal that decreases in a similar fashion with the $-\theta$ rotation. Control circuitry 44 takes a difference between the signals from the two sensors 38 as an indication of the rotation $\theta$ of mirror 32 about axis 36.

In a similar fashion, the difference between the piezoresistive signals from strain sensors 40, on the opposing sides of axis 30, gives an indication of the angle of rotation of gimbal 26 about axis 30. Control circuitry 44 may combine the differences between the signals from the two pairs of strain sensors 40 on the two opposing hinges 28 in order to extract an accurate indication of the angle of the gimbal angle ϕ.

The types and locations of sensors 38 and 40, as well as the configuration of hinges 28 and other components of rotational assembly 50, are shown in FIGS. 2-4 solely by way of example. In general, the form, thickness and length of hinges 28 and 34, the choice and concentration of dopants in sensors 38 and 40, and the locations of the measurement points may be selected, based on first principles and/or empirical measurements, to give the desired range of resistance variation.

In practice, the signals output by strain sensors 38 and 40 typically contain a certain amount of crosstalk, i.e., the resistance of sensor 38 is also affected by the torsional stress in hinge 28, while the resistance of sensors 40 is affected by the bending stress. The varying resistances of sensors 38 and 40 can be calibrated as a function of rotation angle, for example by principal component analysis, in order to find correction factors that will compensate for the crosstalk. The corrections can typically be expressed as linear combinations of the differential signals from the pairs of sensors 38 and 40. The resulting corrected signals, referred to herein as "$V_{Slow}$" and "$V_{Fast}$," give accurate indications of the rotational angles θ and ϕ. During operation of apparatus 20, control circuitry 44 can apply these corrections to the signals provided by sensors 38 and 40 in closed-loop control and monitoring of the scan angle of the assembly.

Figure 5A:
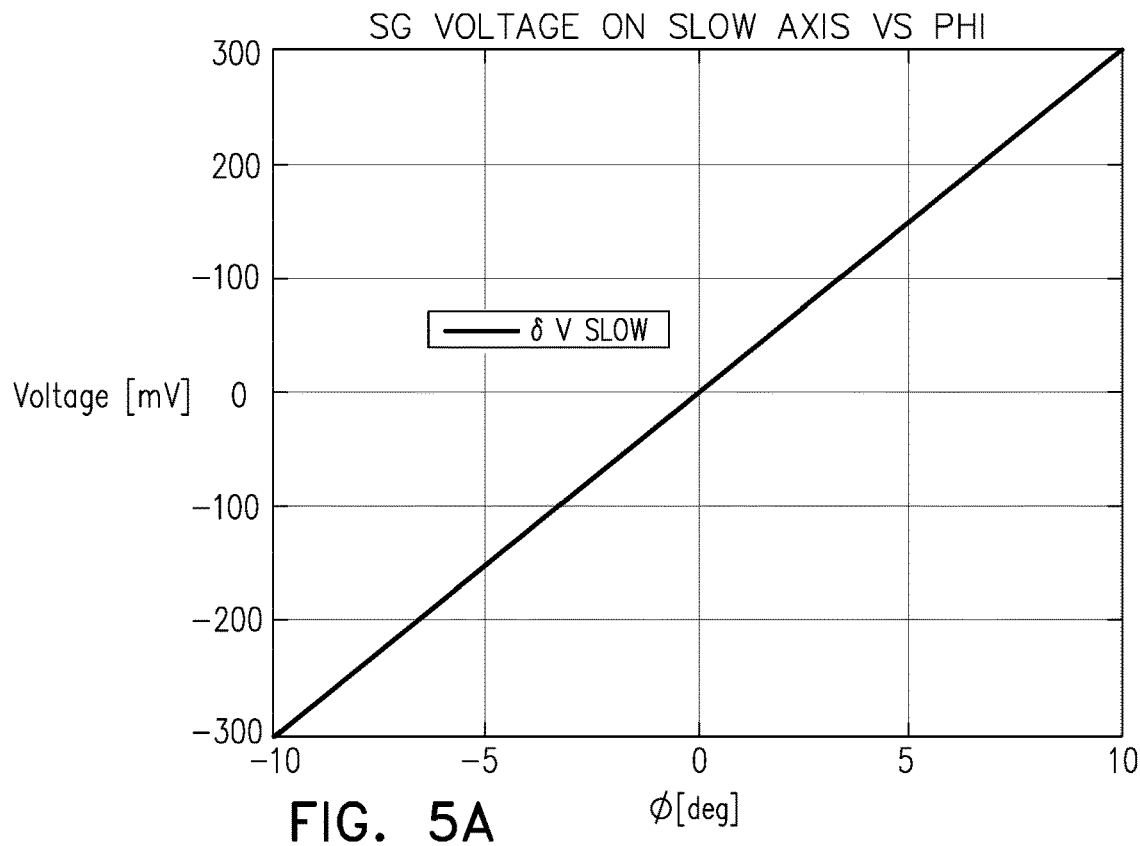
FIGS. 5A and 5B are plots that schematically show the dependence of corrected differential signals $V_{Slow}$ and $V_{Fast}$ on the rotational angles $\phi$ and $\theta$, respectively, of a rotational assembly, in accordance with an embodiment of the invention.
Figure 5B:
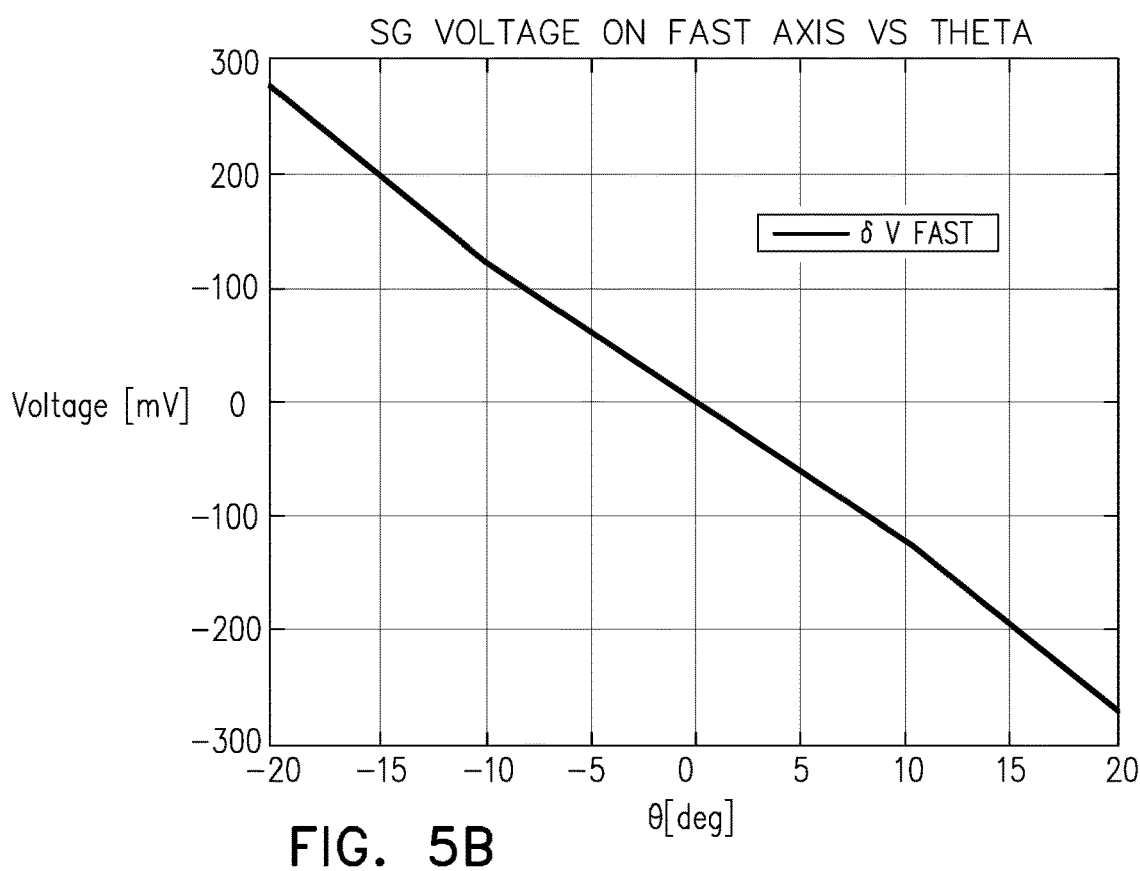

FIGS. 5A and 5B are plots that schematically show the dependence of the corrected differential signals $V_{Slow}$ and $V_{Fast}$ on the rotational angles ϕ and θ, respectively, in accordance with an embodiment of the invention. FIG. 5A illustrates the variation of $V_{Slow}$ with the rotation of gimbal 26, while FIG. 5B illustrates the variation of $V_{Fast}$ with the rotation of mirror 32. As the variations are very nearly linear, they provide control circuitry 44 with an accurate indication of both rotations.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. Mechanical apparatus, comprising:
  a rotational assembly, comprising:
    a frame;
    a gimbal, which is attached to the frame by first hinges disposed along a first axis and is configured to rotate on the first hinges about the first axis relative to the frame; and
    a rotating element, which is attached to the gimbal by second hinges disposed along a second axis, perpendicular to the first axis, and is configured to rotate on the second hinges about the second axis relative to the gimbal;
  one or more strain sensors disposed on at least one of the first hinges and configured to provide a signal indicative of a rotation of the rotating element about the second axis relative to the gimbal; and
  control circuitry configured to monitor the rotation of the rotating element about the second axis responsively to the signal.

2. The apparatus according to claim 1, wherein the one or more strain sensors comprise at least one first strain sensor and at least one second strain sensor disposed on the at least one of the first hinges, wherein the at least one first strain sensor is configured to provide a first signal indicative of a rotation of the gimbal about the first axis, and the at least one second strain sensor is configured to provide a second signal indicative of the rotation of the rotating element about the second axis.

3. The apparatus according to claim 2, wherein the at least one first strain sensor comprises at least two first strain sensors, which are disposed on the at least one of the first hinges in mutually-adjacent locations on opposing sides of the first axis.

4. The apparatus according to claim 2, wherein the at least one first strain sensor is configured to provide the first signal in response to a torsional stress in the at least one of the first hinges, while the at least one second strain sensor is configured to provide the second signal in response to a bend stress induced in the at least one hinge due to the rotation of the rotating element about the second axis.

5. The apparatus according to claim 1, wherein the first hinges comprise a pair of first hinges disposed between the gimbal and the frame on opposing sides of the gimbal, and wherein the one or more strain sensors comprise at least one respective strain sensor disposed on each of the pair of the first hinges.

6. The apparatus according to claim 1, wherein the rotating element comprises a mirror, and the apparatus comprises a drive assembly, which is coupled to scan the mirror about the first and second axes, and the control circuitry is configured to control the drive assembly responsively to the signal.

7. The apparatus according to claim 1, wherein at least the frame, the gimbal, the rotating element and the hinges are formed from a semiconductor substrate in a microelectromechanical systems (MEMS) process, and the one or more strain sensors are formed on the semiconductor substrate as a part of the MEMS process.

8. The apparatus according to claim 7, and comprising a terminal disposed at an edge of the frame for connection to the control circuitry, and electrical traces running on the semiconductor substrate along the at least one of the first hinges between the one or more strain sensors and the terminal.

9. The apparatus according to claim 1, wherein the one or more strain sensors have a resistance that varies responsively to a strain in the first hinges, and wherein the control circuitry is configured to measure an angle of the rotation of the rotating element responsively to the varying resistance.

10. The apparatus according to claim 1, wherein the gimbal and the hinges comprise a semiconductor material, and wherein the one or more strain sensors each comprise a cruciform doped region within the semiconductor material having two pairs of mutually-perpendicular arms, and wherein the control circuitry is coupled to respective ends of the arms in order to sense the angle of the rotation.

11. A method for rotational control, comprising:
  attaching a gimbal to a frame by first hinges disposed along a first axis so that the gimbal rotates on the first hinges about the first axis relative to the frame;
  attaching a rotating element to the gimbal by second hinges disposed along a second axis, perpendicular to the first axis, so that the rotating element rotates on the second hinges about the second axis relative to the gimbal;

disposing one or more strain sensors on at least one of the first hinges so as to provide a signal indicative of a rotation of the rotating element about the second axis relative to the gimbal; and monitoring the rotation of the rotating element about the second axis responsively to the signal.

12. The method according to claim 11, wherein disposing the one or more strain sensors comprises disposing at least one first strain sensor and at least one second strain sensor on the at least one of the first hinges, wherein the at least one first strain sensor provides a first signal indicative of a rotation of the gimbal about the first axis, and the at least one second strain sensor provides a second signal indicative of the rotation of the rotating element about the second axis.

13. The method according to claim 12, wherein disposing the at least one first strain sensor comprises disposing at least two first strain sensors on the at least one of the first hinges in mutually-adjacent locations on opposing sides of the first axis.

14. The method according to claim 12, wherein the first signal is responsive to a torsional stress in the at least one of the first hinges, while the second signal is responsive to a bend stress induced in the at least one hinge due to the rotation of the rotating element about the second axis.

15. The method according to claim 11, wherein attaching the gimbal comprises attaching a pair of first hinges between the gimbal and the frame on opposing sides of the gimbal, and wherein disposing the one or more strain sensors comprises disposing at least one respective strain sensor disposed on each of the pair of the first hinges.

16. The method according to claim 11, wherein the rotating element comprises a mirror, and the method comprises scanning the mirror about the first and second axes, and controlling the scanning responsively to the signal.

17. The method according to claim 11, wherein at least the frame, the gimbal, the rotating element and the hinges are formed from a semiconductor substrate in a microelectromechanical systems (MEMS) process, and disposing the one or more strain sensors comprises forming the strain sensors on the semiconductor substrate as a part of the MEMS process.

18. The method according to claim 17, and comprising disposing a terminal at an edge of the frame for connection to control circuitry, which monitors the rotation, and electrical traces running on the semiconductor substrate along the at least one of the first hinges between the one or more strain sensors and the terminal.

19. The method according to claim 11, wherein the one or more strain sensors have a resistance that varies responsively to a strain in the first hinges, and wherein monitoring the rotation comprises measuring an angle of the rotation of the rotating element responsively to the varying resistance.

20. The method according to claim 11, wherein the gimbal and the hinges comprise a semiconductor material, and wherein the disposing the one or more strain sensors comprises forming one or more cruciform doped regions within the semiconductor material having two pairs of mutually-perpendicular arms, and wherein monitoring the rotation comprises coupling control circuitry to respective ends of the arms in order to sense the angle of the rotation.

* * * * *